US012153480B2

(12) United States Patent
Pennington, Jr. et al.

(10) Patent No.: US 12,153,480 B2
(45) Date of Patent: *Nov. 26, 2024

(54) COMPUTING DEVICES WITH INTEGRATED AND ISOLATED LIQUID COOLING

(71) Applicant: Hewlett-Packard Development Company, L.P., Spring, TX (US)

(72) Inventors: John William Pennington, Jr., Palo Alto, CA (US); Rahul Shrikant Patil, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 197 days.

This patent is subject to a terminal disclaimer.

(21) Appl. No.: 17/901,147

(22) Filed: Sep. 1, 2022

(65) Prior Publication Data

US 2022/0413575 A1 Dec. 29, 2022

Related U.S. Application Data

(63) Continuation of application No. 17/059,570, filed as application No. PCT/US2018/065560 on Dec. 13, 2018, now Pat. No. 11,460,899.

(51) Int. Cl.
*G06F 1/20* (2006.01)
*H05K 7/20* (2006.01)

(52) U.S. Cl.
CPC ......... *G06F 1/206* (2013.01); *H05K 7/20263* (2013.01); *H05K 7/20945* (2013.01); *G06F 2200/201* (2013.01)

(58) Field of Classification Search
CPC ....................................... G06F 1/206
See application file for complete search history.

(56) References Cited

U.S. PATENT DOCUMENTS

| 5,731,954 | A | 3/1998 | Cheon |
| 6,567,262 | B2 | 5/2003 | Meir |
| 7,069,737 | B2 | 7/2006 | Wang et al. |
| 2004/0008483 | A1 | 1/2004 | Cheon |

(Continued)

FOREIGN PATENT DOCUMENTS

| CN | 1487387 A | * | 4/2004 | ............ G06F 1/203 |
| CN | 101359244 A | | 2/2009 | |

(Continued)

*Primary Examiner* — Suresh Suryawanshi
(74) *Attorney, Agent, or Firm* — Quarles & Brady LLP

(57) ABSTRACT

An example computing device includes: a housing; a liquid cooling system; a first compartment of the housing that contains processing components; a second compartment of the housing that contains cooling components of the liquid cooling system; an airgap in the housing that physically separates and thermally isolates the first compartment and the second compartment, the airgap defined by external surfaces of the housing; and, a conduit of the housing that joins the first compartment and the second compartment at a side of the airgap, the conduit routing, internal to the housing, tubing of the liquid cooling system from the first compartment to the second compartment, the tubing conveying liquid that carries heat from the processing components to the cooling components for dissipation.

15 Claims, 7 Drawing Sheets

(56) References Cited

U.S. PATENT DOCUMENTS

| | | | |
|---|---|---|---|
| 2006/0213645 A1* | 9/2006 | Wintersteen | G06F 1/20 165/104.19 |
| 2007/0034353 A1* | 2/2007 | Liu | H01L 23/473 361/698 |
| 2007/0047203 A1 | 3/2007 | Chen | |
| 2007/0125523 A1 | 6/2007 | Bhatti et al. | |
| 2010/0290190 A1 | 11/2010 | Chester et al. | |
| 2011/0058330 A1 | 3/2011 | Abraham et al. | |
| 2014/0043751 A1 | 2/2014 | Merz et al. | |
| 2017/0181322 A1 | 6/2017 | Shelnutt et al. | |
| 2017/0347498 A1 | 11/2017 | Janak et al. | |
| 2018/0299931 A1 | 10/2018 | Li et al. | |
| 2019/0202283 A1* | 7/2019 | Plecko | H05K 7/20909 |

FOREIGN PATENT DOCUMENTS

| | | | | |
|---|---|---|---|---|
| CN | 104756618 A | | 7/2015 | |
| DE | 202004001502 U1 * | | 7/2004 | G06F 1/20 |
| WO | WO-9726781 A1 * | | 7/1997 | G06F 1/20 |
| WO | 2018/222618 A1 | | 12/2018 | |

* cited by examiner

COMPUTING DEVICES WITH INTEGRATED AND ISOLATED LIQUID COOLING

CROSS-REFERENCE TO RELATED APPLICATIONS

The present application is a continuation of U.S. patent application Ser. No. 17/059,570, filed Nov. 30, 2020, and which was filed under 35 U.S.C. § 371 as a national phase entry of International Patent Application No. PCT/US2018/065560, filed on Dec. 13, 2018, the contents of all of which is incorporated herein by reference.

BACKGROUND

Personal computers for gaming, and other types of heavy duty processing applications, include powerful processors and graphics boards that can get very hot during heavy usage. As such, liquid cooling has been used to cool components that get hot, but such liquid cooling systems can be challenging to integrate without degrading cooling performance.

BRIEF DESCRIPTION OF THE DRAWINGS

Reference will now be made, by way of example only, to the accompanying drawings in which.

DETAILED DESCRIPTION

Personal computers for gaming, and other types of heavy duty processing applications, include powerful processors, and/or graphics boards that can get very hot during heavy usage. As such, liquid cooling has been used to cool components that get hot, but such liquid cooling systems can be challenging to integrate. For example, a liquid cooling system may be inside a housing of a computing device, in a same compartment as the internal components of the computing device that are being cooled, and/or other heat generating components; such a location may cause preheating of air used by cooling components (such as heat exchangers) of the liquid cooling system which may reduce cooling to the internal components of the computing device, and/or reduce liquid cooling efficiency of the liquid cooling system. While the cooling components of the liquid cooling system may be located outside the housing of the computing device, such an approach requires that tubing of the cooling system be routed outside the housing to the cooling components.

Hence, provided herein is a computing device with integrated and isolated liquid cooling. The computing device comprises a housing that includes a first compartment that contains processing components, and a second compartment that contains cooling components of a liquid cooling system. The two compartments are separated by an airgap, and/or an aperture in the housing, that physically separates and thermally isolates the first compartment and the second compartment, the airgap, and/or the aperture, defined by external surfaces of the housing. The two compartments are joined, at one side, or opposing sides, of the airgap and/or aperture by a conduit and/or conduits that provide an internal path within the housing for tubes and electrical wires of the liquid cooling system that convey liquid carrying heat from the processing components in the first compartment to the cooling components in the second compartment. Hence, the liquid cooling system, and/or the cooling components of the liquid cooling system, are integrated into the computing device, but isolated from the processing components that emit heat.

Figure 1:
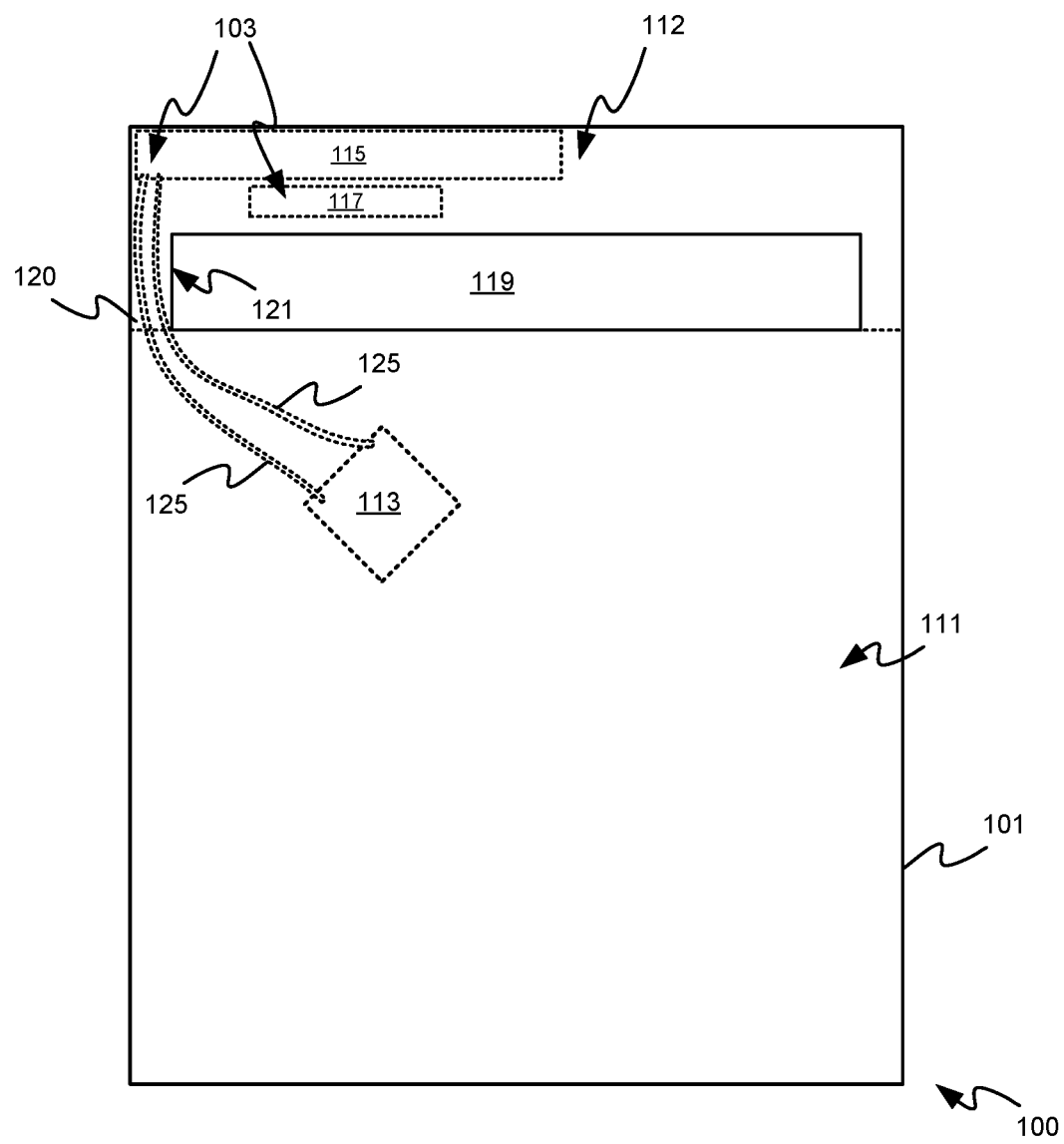
FIG. 1 is a side external view of an example computing device with integrated and isolated liquid cooling, with internal components depicted in outline.

Referring to FIG. 1, a side external view of an example computing device 100 with integrated and isolated liquid cooling is depicted, with internal components depicted in outline. The computing device 100 is interchangeably referred to hereafter as the device 100. The device 100 comprises a housing 101 and a liquid cooling system 103. The device 100 further comprises a first compartment 111 of the housing 101 and a second compartment 112 of the housing 101. The first compartment 111 of the housing 101 contains processing components 113. The second compartment 112 of the housing 101 contains cooling components 115, 117 of the liquid cooling system 103 described in more detail below.

The device 100 further comprises an airgap 119 in the housing 101 that physically separates and thermally isolates the first compartment 111 and the second compartment 112, the airgap 119 defined by external surfaces of the housing 101.

The device 100 further comprises a conduit 120 of the housing 101 that joins the first compartment 111 and the second compartment 112 at a side 121 of the airgap 119. The side 121 further corresponds to an airgap-facing side of the conduit 120.

The conduit 120 routes, internal to the housing 101, tubing 125 of the liquid cooling system 103 from the first compartment 111 to the second compartment 112, the tubing 125 conveying liquid that carries heat from the processing components 113 to the cooling components 115, 117 for dissipation.

Hence, for example, the cooling components 115, 117, such as a heat exchanger and/or a fan, are physically and thermally isolated from the processing components 113, as the cooling components 115, 117 are located in the second compartment 112, and the processing components 113 are located in the first compartment 111 and separated by the airgap 119. The tubing 125 is routed through the conduit 120 which further restricts air flow, and/or heat flow, between the first compartment 111 and the second compartment 112. Hence, the first compartment 111 and the second compartment 112 are further physically and thermally isolated from each other via the conduit 120 while the conduit 120 further physically connects the first compartment 111 and the second compartment 112 (e.g., at a distance from each other), while providing a path for the tubing 125 and/or the liquid contained therein and/or the heat.

The processing components 113 may include a central processing unit (CPU) and/or a graphics processing unit and/or a graphics card, and the like.

While the liquid cooling system 103 is described as including the cooling components 115, 117 and the tubing 125, the liquid cooling system 103 may comprise any other suitable components including, but not limited to, a pump, an external connection to a liquid source, and the like. For example, the liquid may be water and the device 100 may include an external connection to a water tap, and the like. However, the liquid cooling system 103 may be a closed-loop liquid cooling system in which heated liquid is conveyed from the processing components 113 to the cooling components 115, 117 by a first tube of the tubing 125 and cooled liquid is conveyed from the cooling components 115, 117 back to the processing components 113 by a second tube of the tubing 125 (e.g., as depicted).

Furthermore, the processing components 113 may be adapted for use with the liquid cooling system 103, and hence may include a reservoir or reservoirs, and the like, to receive the liquid of the tubing 125, the reservoir or reservoirs for promoting heat exchange between the processing components 113 and the liquid.

Figure 2:
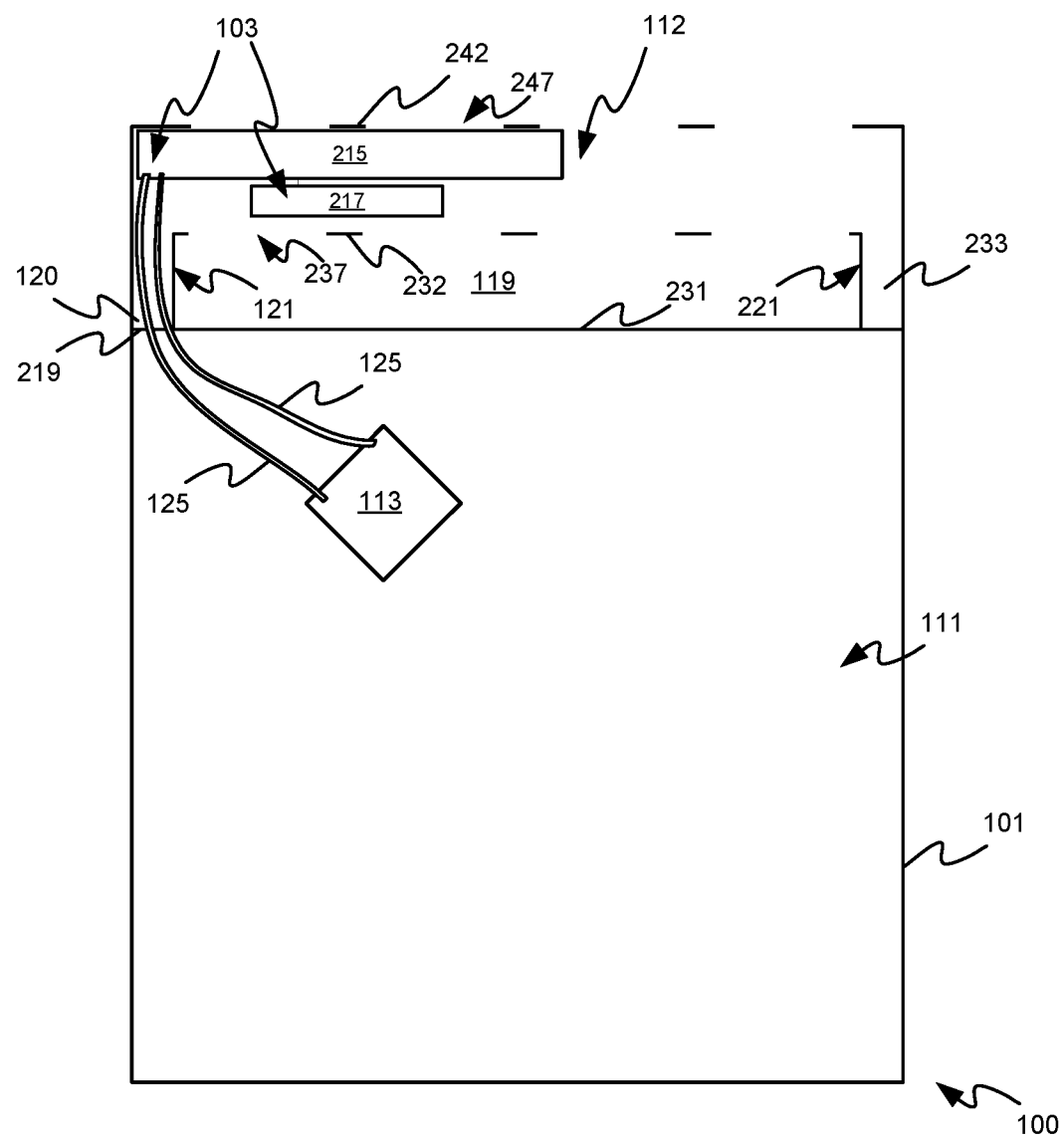
FIG. 2 is a side view of the example computing device of FIG. 1 with a side removed to show the internal components.

Referring next to FIG. 2, a side view of the example device 100 is depicted with a side of the housing 101 removed to show the internal components including the interior of the first compartment 111, which contains the processing components 113, and the interior of the second compartment 112 which contains the cooling components 115, 117. For example as depicted the cooling components 115, 117 include a heat exchanger 215 and a fan 217 (which respectively correspond to the cooling components 115, 117 of FIG. 1). While only one heat exchanger 215 and one fan 217 are depicted, the cooling components 115, 117 may include more than one heat exchanger 215, and/or more than one fan 217.

FIG. 2 further shows the tubing 125 routed from the processing component 113 into the conduit 120 at a side 121 of the airgap 119 to the heat exchanger 215. In particular, as depicted, the device 100 may include material 219 in the conduits 120 that restricts airflow between the first compartment 111 and the second compartment 112. For example, as depicted, the material 219 comprises a panel which include holes, and the like, through which the tubing 125 passes. However, the material 219 may include thermally insulating material, and the like.

While, as depicted, the panel of the material 219 separates the conduit 120 from the first compartment 111, and the conduit 120 is open to the second compartment 112, in other examples, the conduit 120 may include a panel that separates the conduit 120 from the second compartment 112 (with holes and the like for the tubing 125).

While not depicted, the conduit 120 may further route, internal to the housing 101, a power cable and/or power cables to the fan 217 from a power supply (not depicted) contained in the first compartment 111 (e.g., with the material 219 adapted to include a hole and/or holes for a power cable for the fan 217).

The side 121 of the airgap 119 (as well as an opposing side 221) generally join respective airgap-facing sides 231, 232 of the first compartment 111 and the second compartment 112. In general, the airgap-facing sides 231, 232 of the first compartment 111 and the second compartment 112 oppose one another across the airgap 119. As depicted, the airgap-facing sides 231, 232 of the first compartment 111 and the second compartment 112 are about parallel to one another; however the airgap-facing sides 231, 232 of the first compartment 111 and the second compartment 112 may be at any suitable angle and/or angles to each other to increase an area for air entry into the second compartment 112.

Furthermore, while as depicted the second compartment 112 includes a hollow region 233 that extends to the first compartment 111 (e.g., which may be used as an alternative conduit therebetween), the hollow region 233, and the first compartment 111, are separated by a panel that does not include openings (e.g., which may be adapted to include openings for tubing 125 when the hollow region 233 is used as an alternative conduit). The hollow region 233 may also be filled, and/or partially filled, with thermally insulating material to assist with preventing heat from flowing between the compartments 111, 112.

In particular, as described above, the cooling components 115, 117 of the second compartment 112 include a fan 217, positioned at the airgap-facing side 232 of the second compartment 112 to draw unheated external air from the airgap 119 into the second compartment 112 to assist with dissipating the heat conveyed to cooling components by the tubing 125. For example, as depicted, the airgap-facing side 232 of the second compartment 112 includes openings 237 and/or vents to draw air into the second compartment 112, for example via the fan 217. While the openings 237 are depicted in particular positions in FIG. 2, the openings 237 may be in any suitable location in the airgap-facing side 232.

Furthermore, as described above, the cooling components 115, 117 of the second compartment 112 include a heat exchanger 215 connected to the tubing 125. with the fan 217 positioned at the airgap-facing side 232 of the second compartment 112 to draw air from the airgap 119 across the heat exchanger 215 (e.g., through the openings 237). Furthermore, an opposing side 242 of the second compartment 112, opposing the airgap-facing side 232, include openings 247 or vents through which the air exits the second compartment 112. While the openings 247 are depicted in particular positions in FIG. 2, the openings 247 may be in any suitable location in the airgap-facing side 232.

Hence, for example air is drawn into the second compartment 112 from the airgap 119 through the openings 237 via the fan 217; the air flows across the heat exchanger 215. Liquid from a first tube of the tubing 125 generally flows into the heat exchanger 215 carrying the heat from the processing components 113, and the air that flows across the heat exchanger 215 dissipates the heat from the liquid in the heat exchanger 215 through the openings 247. As such, the heat exchanger 215 may include heat fins, and the like, positioned to radiate heat through the openings 247. The liquid then flows out of the heat exchanger 215 through a second tube of the tubing 125 back to the processing components 113 to again carry heat to the heat exchanger 215.

While the heat exchanger 215 is described with respect to heat fins, and the like, the heat exchanger 215 may have any suitable configuration, and/or be any suitable type of the heat exchanger.

Figure 3:
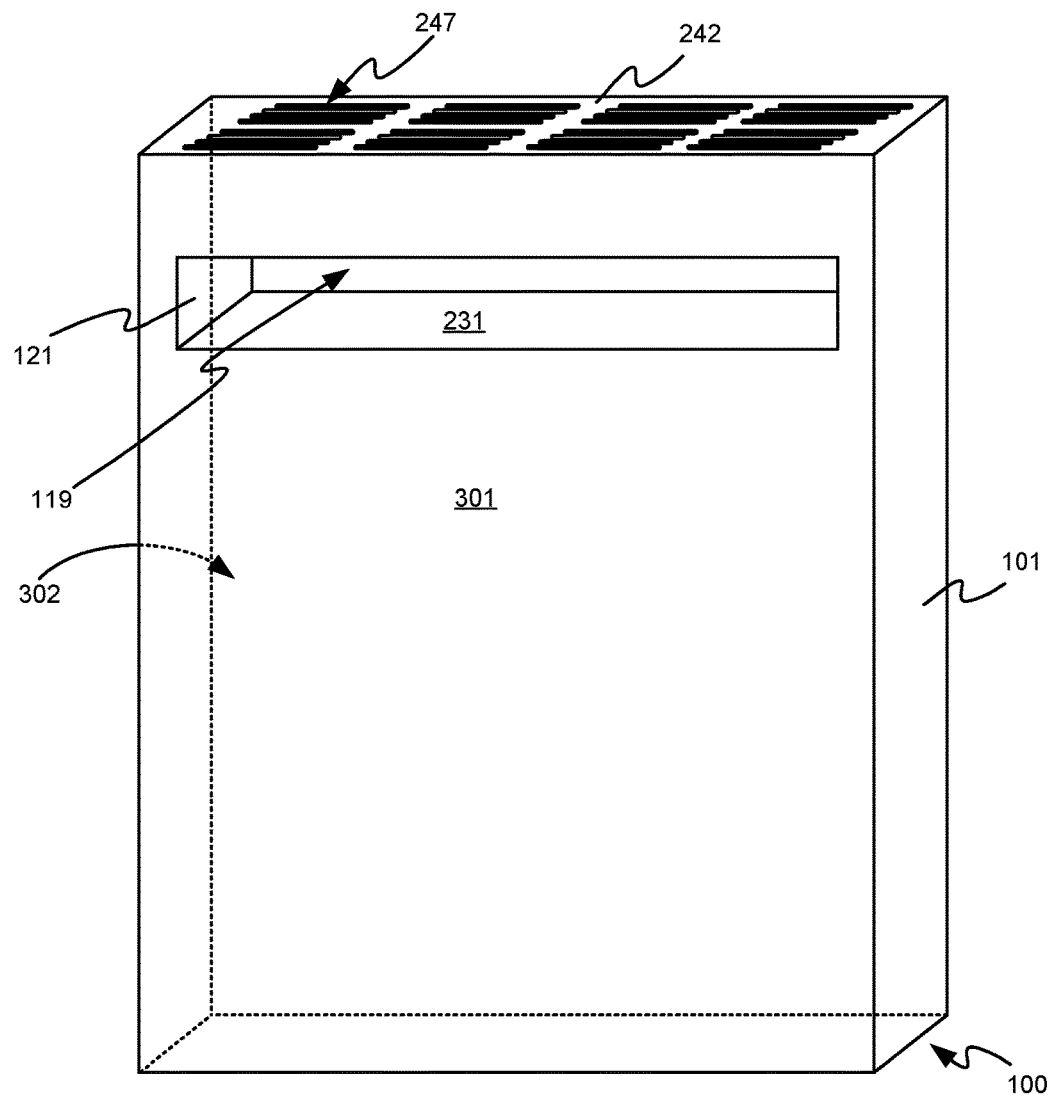
FIG. 3 is a perspective top view of the example computing device of FIG. 1 showing an airgap-facing side of a first compartment that contains processing components, and an opposing side of a second compartment that contains cooling components, the opposing side opposing a respective airgap-facing side of the second compartment.

Attention is next directed to FIG. 3 which depicts a perspective top view of the example device 100 of FIG. 1.

FIG. 3 showing the airgap-facing side 231 of the first compartment 111 and the opposing side 242 of the second compartment 112. In the view of FIG. 3, the airgap 119 is shown as being through the housing 101. For example, the airgap 119 extends from a first external surface 301 of the housing 101 through to a second external surface 302 of the housing 101, the external surfaces 301, 302 opposing one another. The external surface 302 is depicted in outline to indicate that the external surface 302 is located behind the external surface 301, and/or is otherwise hidden in FIG. 3. The external surfaces 301, 302 are joined by side and bottom external surfaces of the housing 101, as well as by sides 121, 221 of the airgap 119, and the airgap-facing sides 231, 232 of the compartments 111, 112 (which also correspond to surfaces of the airgap 119 which join the sides 121, 221).

Furthermore, the opposing external surfaces 301, 302 of the housing 101 each include respective external surfaces of the first compartment 111, the second compartment 112 and the conduit 120, such that, for example, the surfaces of the housing 101 which coincide with the first compartment 111, the second compartment 112 and the conduit 120 form respective surfaces of the first compartment 111, the second compartment 112 and the conduit 120. However, the housing 101 and/or the first compartment 111 and/or the second compartment 112 and/or the conduit 120 may be fabricated from any suitable number of panels, and the like using, for example, sheet metal.

As is further depicted in FIG. 3, the airgap-facing side 231 of the first compartment 111 is closed to prevent heat from the first compartment 111 from flowing into the airgap 119, for example via convection.

As is further depicted in FIG. 3, the opposing side 242 of the second compartment 112 includes the openings 247, for example in a venting pattern, for heat from the heat exchanger 215 to vent therethrough.

Figure 4:
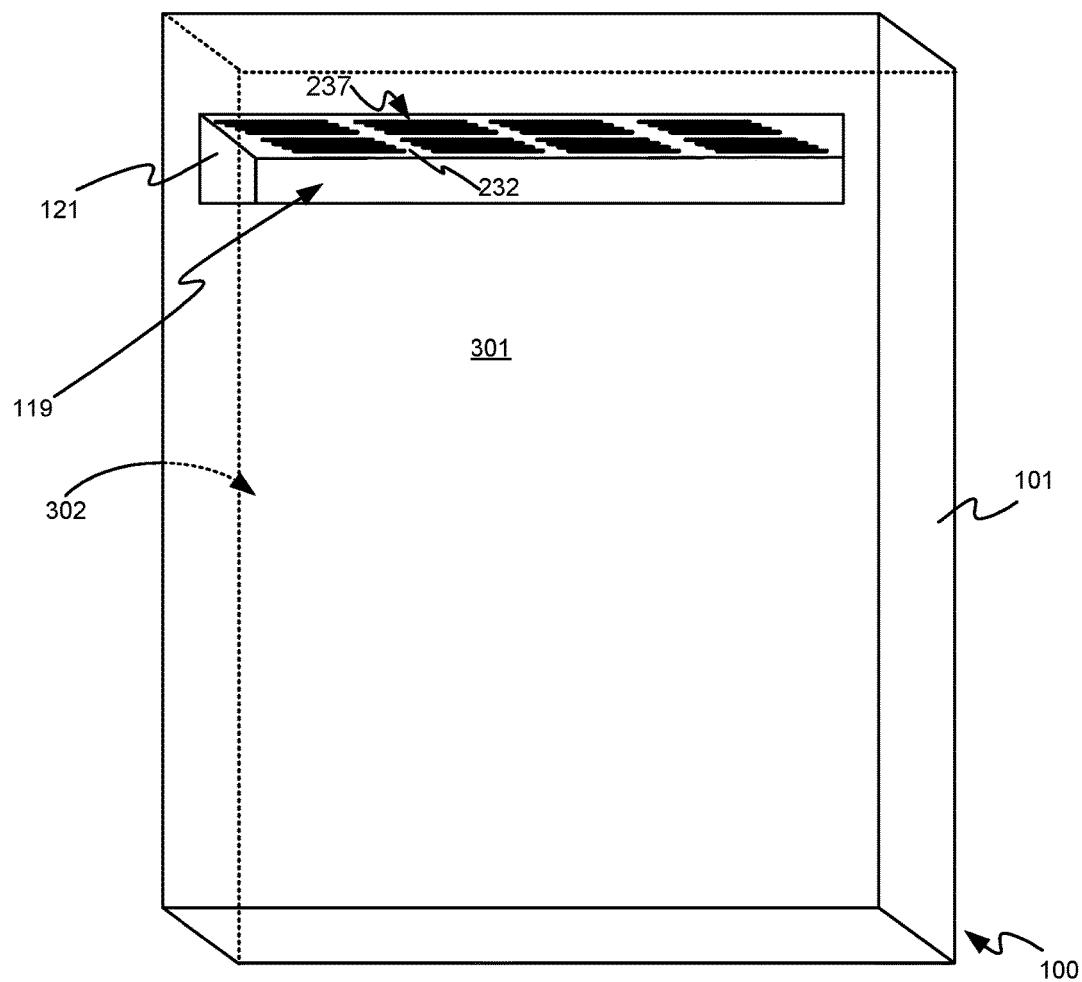
FIG. 4 is a perspective bottom view of the example computing device of FIG. 1 showing the airgap-facing side of the second compartment that contains cooling components.

Attention is next directed to FIG. 4 which depicts a perspective bottom view of the example device of FIG. 1 showing the airgap-facing side 232 of the second compartment 112, as well as the external surface 301 of the housing 101, and the side 121 of the airgap 119. As in FIG. 3, airgap 119 is shown as being through the housing 101 and extending between the external surfaces 301, 302, with the external surface 302 understood to be hidden in FIG. 4.

FIG. 4 further shows the openings 237 in the airgap-facing side 232 of the second compartment 112 through which air from the airgap 119 flows into the second compartment 112, the openings 237 arranged in a venting pattern.

FIG. 4 further shows that the airgap-facing side 232 of the second compartment 112 extends from the first external surface 301 to the second external surface 302.

Hence, as depicted in FIG. 3 and FIG. 4, the airgap 119 is through the housing 101 from the first external surface 301 of the housing 101 to the second external surface 302 of the housing 101, the airgap 119 defined by opposing airgap-facing sides 231, 232 of the first compartment 111 and the second compartment 112, and an airgap-facing side of the conduit 120 (e.g., which coincides with the side 121 of the airgap 119).

Hence, from FIG. 3 and FIG. 4, the airgap 119 is understood to comprise an aperture through the housing 101 and/or a hole through the housing 101, and the like. However, the airgap 119 may have other configurations.

Figure 5:
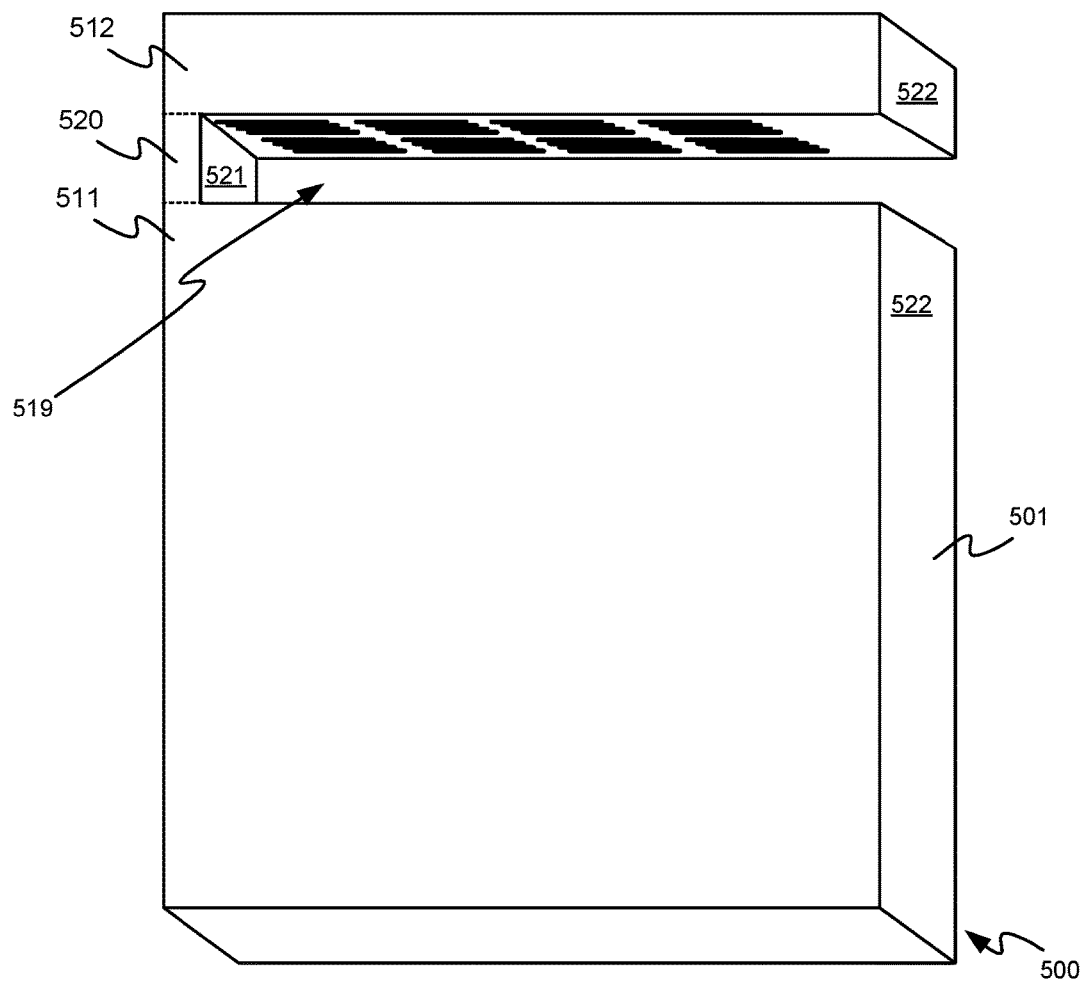
FIG. 5 is a perspective bottom view of another example computing device with integrated and isolated liquid cooling.

For example, attention is next directed to FIG. 5 which depicts a perspective bottom view of an example computing device 500 similar to the device 100. Hence, like the device 100, the computing device 500 includes a housing 501, a first compartment 511, that contains processing components (not depicted), and a second compartment 512, that contains cooling components not depicted) of a liquid cooling system. While internal components of the computing device 500 are not depicted, internal components corresponding to the internal components of the device 100 are nonetheless understood to be present.

The computing device 500 further includes an airgap 519 in the housing 501 that physically separates and thermally isolates the first compartment 511 and the second compartment 512, the airgap 519 defined by external surfaces of the housing 501. The computing device 500 further includes a conduit 520 of the housing 501 that joins the first compartment 511 and the second compartment at a side 521 of the airgap 519. The conduit 520 generally routes tubing between the compartments 511, 512. In FIG. 5, the internal positions of the first compartment 511, the second compartment 512 and the conduit 520 are depicted in outline.

However, in contrast to the airgap 119, which comprises an aperture and/or hole, the airgap 519 comprises a bight in the housing and/or an absence of material in the housing 501 and/or a slot in the housing 501 that extends from the conduit 520 through to an opposite side 522 of the housing 501. For example, as depicted, the second compartment 512 forms a shelf that is cantilevered and/or hanging, and the like, relative to the airgap 519 and supported by the conduit 520.

In yet further examples, computing devices with integrated and isolated liquid cooling according to the present specification may have other configurations, and/or be adapted for a plurality of processing components.

Figure 6:
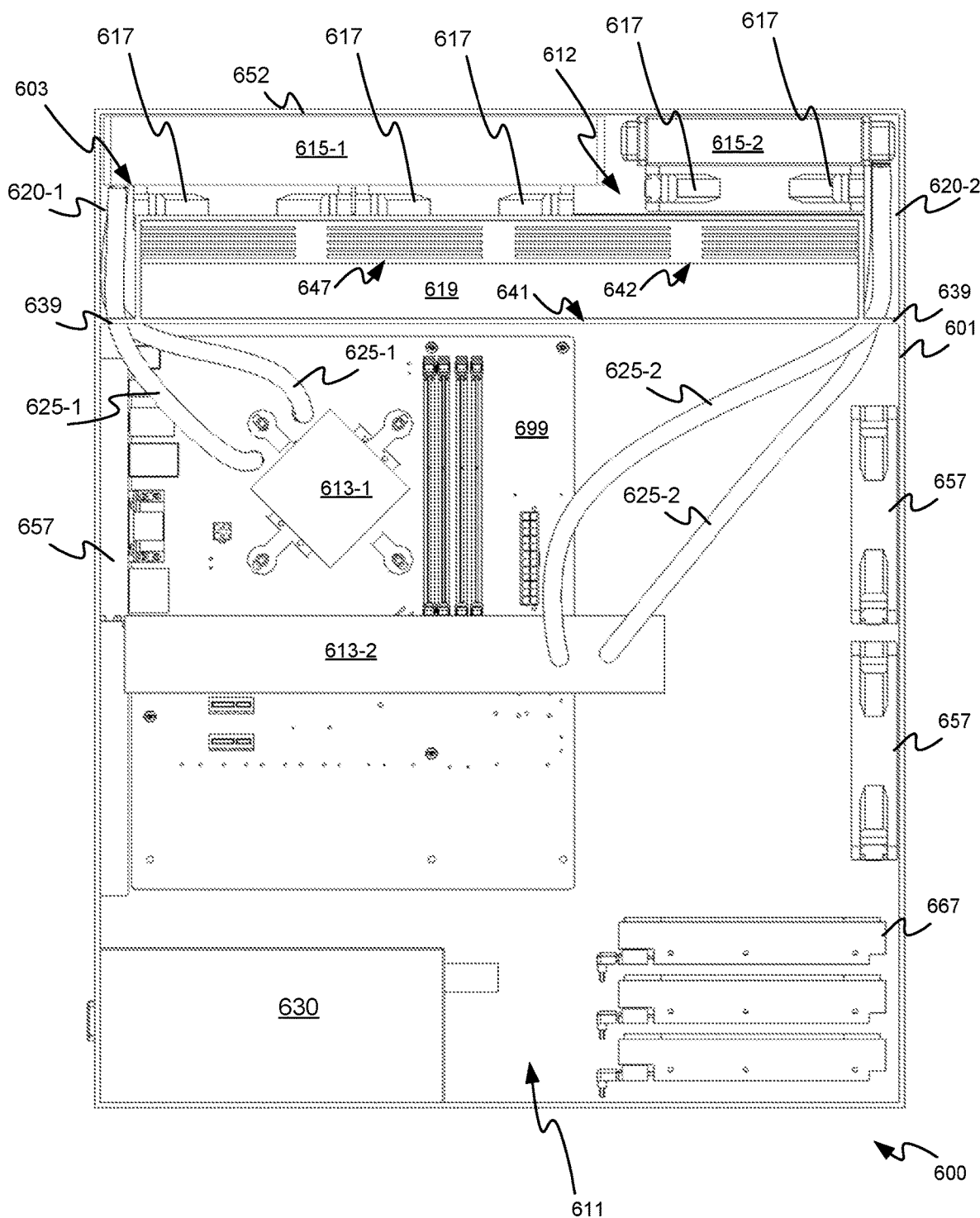
FIG. 6 is a side view of another example computing device with integrated and isolated liquid cooling, with a side removed to show internal components.

For example, attention is next directed to FIG. 6 which depicts an example computing device 600 with integrated and isolated liquid cooling. The computing device 600 (interchangeably referred to hereafter as the device 600), which is similar to the device 100, with like components having like numbers, however in a "600" series rather than a "100" series. However, as will be described below, in contrast to the device 100, the device 600 includes two conduits, two processing components, and two heat exchangers, for example one heat exchanger for each the two processing components. In particular, the device 600 is depicted with a side removed to show internal components thereof, similar to the view of the device 100 in FIG. 2.

As depicted, the device 600 comprises a housing 601 and a liquid cooling system 603. The device 600 further comprises a first compartment 611 of the housing 601 that contains processing components 613-1, 613-2. For example the processing component 613-1 may comprise a central processing unit (CPU) and the processing component 613-2 may comprise a graphics processing unit (GPU) and/or a graphics board. The processing components 613-1, 613-2 are interchangeably referred to hereafter, collectively, as the processing components 613 and, generically, as a processing component 613

The device 600 further comprises a second compartment 612 of the housing 601 that contains cooling components of the liquid cooling system, the cooling components including a heat exchanger and/or heat exchangers 615-1, 615-2 and a fan 617 and/or fans 617. The heat exchangers 615-1, 615-2 are interchangeably referred to hereafter, collectively, as heat exchangers 615 and, generically, as a heat exchanger 615.

The device 600 further comprises an aperture 619 through the housing 601 that separates the first compartment 611 from the second compartment 612. The aperture 619 is similar to the airgap 119 of the device 100.

The device 600 further comprises two conduits 620-1, 620-2 of the housing 601 that join the first compartment 611 and the second compartment 612 on opposite sides of the aperture 619, the two conduits 620-1, 620-2 routing, internal to the housing 601, tubing 625-1, 625-2 of the liquid cooling system 603 from the first compartment 611 to the second compartment 612, the tubing 625-1, 625-2 conveying liquid that carries heat from the processing components 613 to the cooling components for dissipation, and in particular the heat exchangers 615.

The conduits 620-1, 620-2 are interchangeably referred to hereafter, collectively, as the conduits 620 and, generically, as a conduit 620. The tubing 625-1, 625-2 is interchangeably referred to hereafter, collectively, as tubing 625 and, generically, as the tubing 625.

While not depicted, one conduit 620 or both conduits 620 further route, internal to the housing 601, a power cable and/or power cables to the fan and/or fans 617 from a power supply 630 contained in the first compartment 611.

As with the device 100, the two conduits 620 restrict airflow between the first compartment 611 and the second compartment 612 and may include material in the two conduits 620 that restrict airflow between the first compartment 611 and the second compartment 612. The material may include, as depicted, respective panels 639 between the two conduits 620 and the first compartment 611 with holes and/or apertures for the tubing 625. The material may further include thermally insulating material.

While as depicted, the conduits 620 are joined with and/or open to the second compartment 612, in other examples the conduits 620 may include respective panels therebetween, similar to the panels 639, with holes for the tubing 625 (and/or power cables).

While in FIG. 6 the device 600 is depicted with a side removed to show in internal components, it is understood that, like the device 100, the device 600 includes opposing external surfaces of the housing 601 (e.g., similar to the external surfaces 301, 302) which include respective external surfaces of the first compartment 611, the second compartment 612 and the two conduits 620.

As further depicted in FIG. 6, the first compartment 611 and the second compartment 612 each include respective aperture-facing sides 641, 642, described in more detail below.

Furthermore, a fan and/or fans 617 of the second compartment 612 are at the aperture-facing side 642 of the second compartment 612 to draw in air from the aperture 619 (for example through openings 647 at the aperture-facing side 642) and across the heat exchanger and/or heat exchangers 615. Furthermore, as will be shown in FIG. 7 described below, an opposing side 652 of the second compartment 612, opposing the aperture-facing side 642, included openings through which the air exits the second compartment 612 after flowing across the heat exchanger and/or heat exchangers 615.

As depicted in FIG. 6, the device 600 the cooling components in the second compartment 612 includes a first heat exchanger 615-1 to which first tubing 625-1 from first processing components 613-1 are routed, by the conduit 620-1, to cool the first processing components 613-1.

However, as also depicted in FIG. 6, the cooling components in the second compartment 612 further include a second heat exchanger 615-2 to which second tubing 625-2 from second processing components 613-2 are routed, by the conduit 620-2, to cool the second processing components 613-2. Hence, the liquid cooling system 603 includes second tubing 625-2 that runs through the conduit 620-2, internal to the housing 601, from the first compartment 611 to the second compartment 612.

In general, the first tubing 625-1 conveys the heat from the first processing components 613-1 (e.g., such as CPU) to the heat exchanger 615-1, and the second tubing 625-2 conveys the heat from the second processing components 613-2 (e.g., such as GPU and/or graphics card) to the second heat exchanger 615-2.

Indeed, the device 600 may comprise a respective heat exchanger 615 for each of the processing components 613-1, 613-2.

For example, as depicted, the processing components 613 include the first processing components 613-1 and the second processing components 613-2, and the heat exchangers 615 comprising respective heat exchangers 615-1, 615-2 for the first processing components 613-1 and the second processing components 613-2, the tubing 625 carrying respective heat from the first processing components 613-1 and the second processing components 613-2 to the respective heat exchangers 615-1, 615-2.

Indeed, in other examples, the processing components 613 include a plurality of processing components 613 (e.g., more than one processing components 613 and/or more than two processing components 613), the heat exchangers 615 comprising plurality of heat exchangers in a one-to-one relationship with the plurality of processing components 613, the tubing 625 carrying respective heat from the plurality of processing components 613 to respective heat exchangers 615 of the plurality of heat exchangers 615.

Hence, for example, while the device 600 is depicted with only CPU (e.g., processing components 613-1) and one GPU and/or graphics card (e.g., processing components 613-2), the device 600 may comprise more than one CPU and/or more than one GPU and/or graphics card with a respective heat exchanger 615 in the second compartment 612 provided for each, and respective tubing 625 provided for each. However, in other examples, due to space limitations, the device 600 may include a fewer number of heat exchangers 615 than processing components 613.

As depicted, the device 600 may include other types of components including, but not limited to, fans 657 through a wall and/or walls of the first compartment 611, hard drives 667, connectors, computer boards, and/or any other suitable component that may be used with a personal computer and/or a computing device and the like. The fans 657 may be used to provide cooling for components in the first compartment 611 that aren't cooled by the liquid cooling system 603; for example fans 657 at a first wall may draw air into the device 600 while other fans 657 at a second wall opposite the first wall may draw air out of the device 600.

Indeed, as depicted, the first processing components 613-1 are mounted to a computer board 699 and the first tubing 625-1 is routed through respective apertures in the board to route liquid in the first tubing 625-1 to the first processing components 613-1, for example to a reservoir of the first processing components 613-1 on a side of the computer board 699 opposite that depicted in FIG. 6. The second processing components 613-2 may be similarly adapted for the liquid cooling system 603.

As depicted, the aperture-facing side 642 of the second compartment 612 includes openings 647 and/or vents similar to the openings 237 in the airgap-facing side 232 of the device 600. However, while airgap-facing sides 231, 232 of the first compartment 111 and the second compartment 112 are about parallel to one another, as best seen in FIG. 7, the aperture-facing side 642 of the second compartment 612 is in a "V" shape, with a center of the "V" extending into the aperture 619 centered along a longitudinal axis of the aperture 619, such that the openings 647 are angled with respect to the fans 617 and/or the aperture 619 and/or the aperture-facing side 641 of the first compartment 611.

Figure 7:
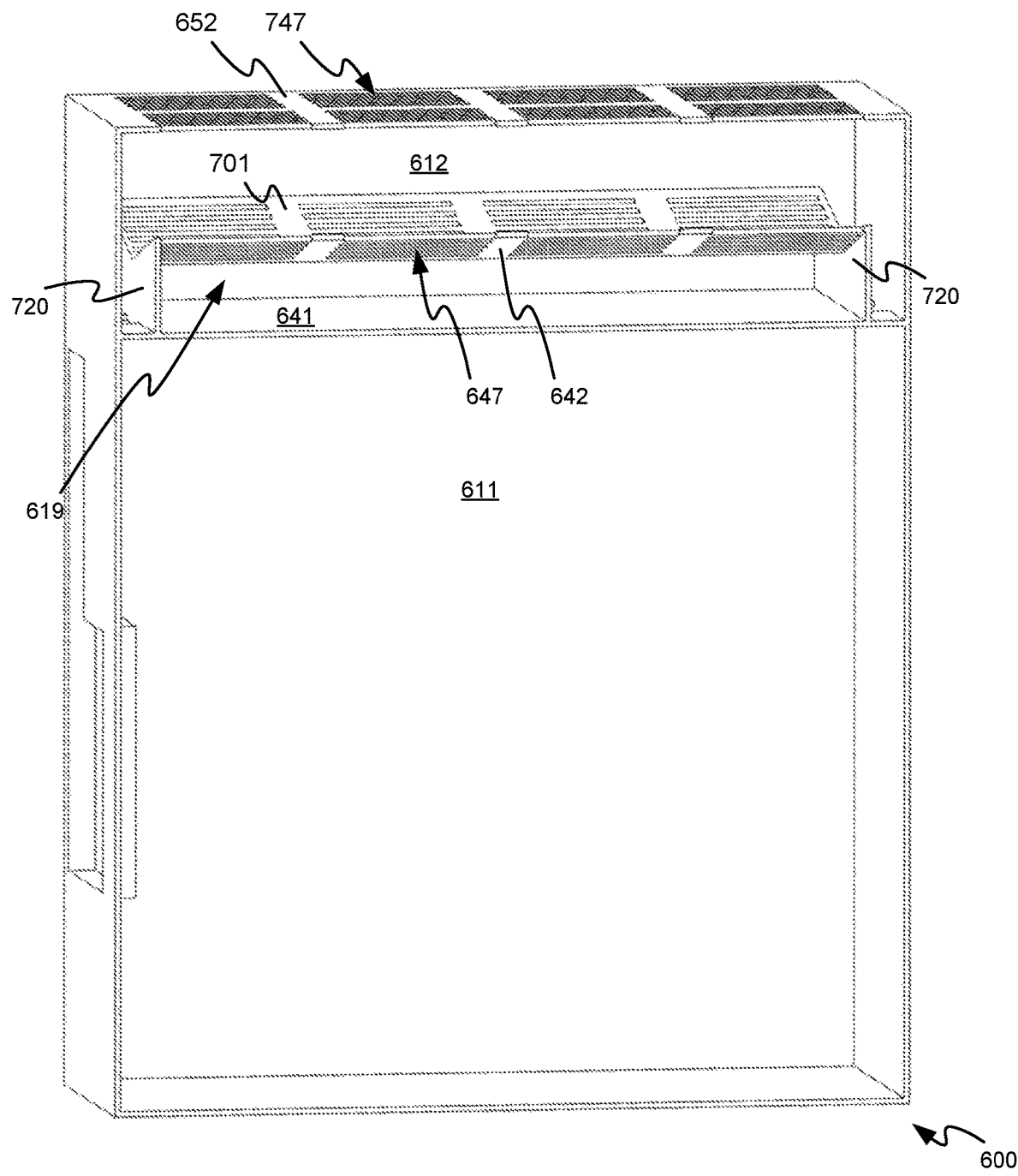
FIG. 7 depicts a top perspective view of the example computing device of FIG. 6, with a side removed and the internal components removed to show an angled plate that forms an aperture-facing side of a second compartment which includes openings.

For example, FIG. 7 depicts a top perspective view of the device 600 with a side removed and the internal components removed to show an angled ("V"-shaped) plate 701 that forms two portions of the aperture-facing side 642 of the second compartment 612 including the openings 647, each of the portions of the aperture-facing side 642 angled in generally opposite directions out of the opening 619. Opposing sides 720 of the aperture 619 that are perpendicular to the aperture-facing side 641 of the first compartment 611 may each include a notch (e.g., a complementary "V"-shaped notch) into which the angled plate 701 is placed and/or attached. Furthermore, the angle of the angled plate 701, and/or the angle of the portions of the aperture-facing side 642, may be selected to promote flow of air into the second compartment 612 by the fans 617 from the aperture 619 and/or a region adjacent to the aperture 619.

In particular, by angling the portions aperture facing side 642 (e.g., in two directions), and hence angling the openings 647, the second compartment 612 has an increased area for air entry, for example as compared to the device 100; as such, the number of openings 647, and/or the area of the openings 647, may be increased as compared to the device 100. Any suitable angle is within the scope of the present specification; as depicted, the angle of each portion of the aperture facing side 642 side is about 15 degrees with respect to the aperture facing side 641, however the angle can be as large as 45 degrees, though the larger the angle, the smaller the opening 619. Hence, selection of the angle may be tradeoff between area of the aperture facing side 642 and the size of the opening 619.

While the plate 701 and the two portions of the aperture-facing side 642 are depicted as a "V"-shape (e.g., along a longitudinal axis of the opening 619 and/or the plate 701 and/or the second compartment 612), the aperture-facing side 642 may be any suitable shape which causes an increased area for air entry into the second compartment 612 (e.g., as compared to the device 100). For example, the aperture-facing side 642 may be curved, and the like.

Furthermore, while present examples are described with respect to the airgap 119 and/or the aperture 619 being rectangular in shape, the airgap 119 and/or the aperture 619 may be in any suitable shape.

FIG. 7 further shows openings 747 and/or vents in the opposing side 652 of the second compartment 612, through which air is vented from the second compartment 612.

It should be recognized that features and aspects of the various examples provided above may be combined into further examples that also fall within the scope of the present disclosure.

The invention claimed is:

1. A computing device comprising:
a housing;
a first compartment of the housing that contains processing components;
a second compartment of the housing that contains cooling components of a liquid cooling system;
two conduits of the housing that joins the first compartment and the second compartment at least one of the two conduits routing, internal to the housing, tubing of the liquid cooling system from the first compartment to the second compartment, the tubing conveying liquid that carries heat from the processing components to the cooling components for dissipation; and
a hole through the housing that physically separates and thermally isolates the first compartment and the second compartment, the hole extending between opposing external surfaces of the housing, the housing defined by opposing hole-facing sides of the first compartment and the second compartment, and respective opposing hole-facing sides of the two conduits.

2. The computing device of claim 1, wherein a hole-facing side of the first compartment is closed.

3. The computing device of claim 1, wherein the cooling components of the second compartment include a fan, the fan positioned at a hole-facing side of the second compartment to draw air from the hole into the second compartment to assist with dissipating the heat.

4. The computing device of claim 1, wherein the cooling components of the second compartment include a heat exchanger connected to the tubing and a fan positioned at a hole-facing side of the second compartment to draw air from the hole across the heat exchanger, an opposing side of the second compartment, opposing the hole-facing side, including openings through which the air exits the second compartment.

5. The computing device of claim 1, wherein the cooling components include a fan, at least one of the two conduits further routing, internal to the housing, a power cable to the fan from a power supply contained in the first compartment.

6. A computing device comprising:
a housing;
a first compartment of the housing that contains processing components;
a second compartment of the housing that contains liquid cooling components;
a hole through the housing from a first external surface of the housing to a second external surface of the housing; and
two conduits of the housing that join the first compartment and the second compartment on opposite sides of the hole, at least one of the two conduits routing, internal to the housing, tubing of the liquid cooling components from the first compartment to the second compartment, the tubing conveying liquid that carries heat from the processing components to the liquid cooling components for dissipation,
wherein the housing is defined by opposing hole-facing sides of the first compartment and the second compartment, and respective opposing hole-facing sides of the two conduits.

7. The computing device of claim 6, further comprising a fan at the second compartment, at least one of the two conduits further routing, internal to the housing, a power cable to the fan from a power supply contained in the first compartment.

8. The computing device of claim 6, wherein the two conduits restrict airflow between the first compartment and the second compartment.

9. The computing device of claim 6, further comprising material in the two conduits that restrict airflow between the first compartment and the second compartment.

10. The computing device of claim 6, wherein opposing external surfaces of the housing each include respective external surfaces of the first compartment, the second compartment and the two conduits.

11. A computing device comprising:
a housing;
a liquid cooling system;
a first compartment of the housing that contains processing components;
a second compartment of the housing that contains cooling components of the liquid cooling system, the cooling components including a fan and a heat exchanger connected to tubing of the liquid cooling system;

a hole through the housing that separates the first compartment from the second compartment; and, conduits of the housing that joins the first compartment and the second compartment at opposing sides of the hole, at least one of the conduits routing, internal to the housing, tubing of the liquid cooling system from the first compartment to the second compartment, the tubing conveying liquid that carries heat from the processing components to the heat exchanger for dissipation, the fan of the second compartment at a hole-facing side of the second compartment to draw in air from the hole across the heat exchanger, an opposing side of the second compartment, opposing the hole-facing side, including openings through which the air exits the second compartment after flowing across the heat exchanger, wherein the hole is from a first external surface of the housing to a second external surface of the housing, the housing defined by opposing hole-facing sides of the first compartment and the second compartment, and respective opposing hole-facing sides of the conduits.

12. The computing device of claim 11, wherein the cooling components in the second compartment further include a second heat exchanger, and the liquid cooling system includes second tubing that runs through at least one of the conduits, internal to the housing, from the first compartment to the second compartment, the tubing conveying the heat from a first processor of the processing components to the heat exchanger, and the second tubing conveying the heat from a second processor of the processing components to the second heat exchanger.

13. The computing device of claim 11, wherein the processing components include first processing components and second processing components, the heat exchanger comprising respective heat exchangers for the first processing components and the second processing components, the tubing carrying respective heat from the first processing components and the second processing components to the respective heat exchangers.

14. The computing device of claim 11, wherein the processing components include a plurality of processing components, the heat exchanger comprising plurality of heat exchangers in a one-to-one relationship with the plurality of processing components, the tubing carrying respective heat from the plurality of processing components to respective heat exchangers of the plurality of heat exchangers.

15. The computing device of claim 11, wherein the processing components include a central processing unit (CPU) and a graphics card, the tubing conveying the heat from the CPU and the graphics card to the heat exchanger.

* * * * *